US006760970B2

(12) United States Patent
Farnworth et al.

(10) Patent No.: US 6,760,970 B2
(45) Date of Patent: *Jul. 13, 2004

(54) METHOD FOR FORMING MODULAR SOCKETS USING FLEXIBLE INTERCONNECTS AND RESULTING STRUCTURES

(75) Inventors: Warren M. Farnworth, Nampa, ID (US); David J. Corisis, Meridian, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/218,334

(22) Filed: Aug. 13, 2002

(65) Prior Publication Data

US 2002/0189092 A1 Dec. 19, 2002

Related U.S. Application Data

(60) Continuation of application No. 09/482,416, filed on Jan. 13, 2000, now Pat. No. 6,453,550, which is a division of application No. 09/072,260, filed on May 4, 1998, now Pat. No. 6,089,920.

(51) Int. Cl.[7] .................................................. H05K 3/00
(52) U.S. Cl. ............................. 29/842; 29/830; 29/832; 29/884; 439/62; 439/67; 439/83
(58) Field of Search ......................... 29/842, 832, 830, 29/845, 831, 854, 884, 837; 439/632, 83, 66, 67, 62

(56) References Cited

U.S. PATENT DOCUMENTS

| | | |
|---|---|---|
| 2,971,179 A | 2/1961 | Heuer |
| 3,573,617 A | 4/1971 | Randolph et al. |
| RE28,171 E | 9/1974 | Anhalt |
| 3,924,915 A | 12/1975 | Conrad |
| 4,113,981 A | 9/1978 | Fujita et al. |
| 4,266,840 A | 5/1981 | Seidler |
| 4,314,736 A | 2/1982 | Demnianiuk |
| 4,381,130 A | 4/1983 | Sprenkle |
| 4,391,408 A | 7/1983 | Hanlon et al. |
| 4,397,512 A | 8/1983 | Barraire et al. |
| 4,418,475 A | 12/1983 | Ammon et al. |
| 4,461,525 A | 7/1984 | Griffin |
| 4,501,461 A | 2/1985 | Anhalt |
| 4,527,850 A | 7/1985 | Carter |
| 4,710,134 A | 12/1987 | Korsunsky |
| 4,781,612 A | 11/1988 | Thrush |
| 4,811,165 A | 3/1989 | Currier et al. |
| 4,889,499 A | 12/1989 | Sochor |
| 4,892,487 A | 1/1990 | Dranchak et al. |
| 4,995,825 A | 2/1991 | Korsunsky et al. |

(List continued on next page.)

OTHER PUBLICATIONS

IBM Journal of Research & Development vol 41, No. ½ Optical lithography, "Negative Photoresists for Optical Lithography" Oct. 16, 1997.

*Primary Examiner*—Peter Vo
*Assistant Examiner*—Minh Trinh
(74) *Attorney, Agent, or Firm*—TraskBritt

(57) ABSTRACT

Methods for forming a modular bare die socket assembly 10 and attaching a plurality of miniature semiconductor dice 18 to a substrate. The socket assembly 10 is comprised of a plurality of two-sided plates 14 joined vertically in a horizontal stack, wherein each plate 14 has a die socket 22 for the removable insertion of a bare semiconductor die 18. A multi-layer interconnect lead tape 50 has a plurality of lithographically formed leads bent on one end to form nodes 88 for attachment to bond pads 90 on the removably inserted semiconductor die 18, and having opposing ends 92 connectable to the substrate.

10 Claims, 10 Drawing Sheets

U.S. PATENT DOCUMENTS

| | | | |
|---|---|---|---|
| 5,020,998 A | 6/1991 | Ikeya et al. | |
| 5,038,250 A | 8/1991 | Uenaka et al. | |
| 5,061,845 A | 10/1991 | Pinnavaia | |
| 5,208,529 A | 5/1993 | Tsurishima et al. | |
| 5,209,675 A | 5/1993 | Korsunsky | |
| 5,242,310 A | 9/1993 | Leung | |
| 5,244,403 A | 9/1993 | Smith et al. | |
| 5,256,078 A | 10/1993 | Lwee et al. | |
| 5,266,833 A | 11/1993 | Capps | |
| 5,358,421 A | 10/1994 | Petersen | |
| RE34,794 E | 11/1994 | Farnworth | |
| 5,444,304 A | 8/1995 | Hara et al. | |
| 5,450,289 A | 9/1995 | Kweon et al. | |
| 5,451,815 A | 9/1995 | Taniguchi et al. | |
| 5,466,169 A | 11/1995 | Lai | |
| 5,489,854 A | 2/1996 | Buck et al. | |
| 5,496,182 A | 3/1996 | Yasumura | |
| 5,592,019 A | 1/1997 | Ueda et al. | |
| 5,593,927 A | 1/1997 | Farnworth et al. | |
| 5,609,489 A | 3/1997 | Bickford et al. | |
| 5,619,067 A | 4/1997 | Sua et al. | |
| 5,628,635 A | 5/1997 | Ikeya | |
| 5,635,760 A | 6/1997 | Ishikawa | |
| 5,644,161 A | 7/1997 | Burns | |
| 5,668,409 A | 9/1997 | Gaul | |
| 5,745,349 A | 4/1998 | Lemke | |
| 5,751,553 A | 5/1998 | Clayton | |
| 5,832,601 A | 11/1998 | Eldridge et al. | |
| 5,834,366 A | 11/1998 | Akram | |
| 5,866,949 A | 2/1999 | Schueller | |
| 5,990,545 A | 11/1999 | Schueller et al. | |
| 6,015,652 A | 1/2000 | Ahlquist et al. | |
| 6,040,739 A | 3/2000 | Wedeen et al. | |
| 6,089,920 A * | 7/2000 | Farnworth et al. | 439/632 |
| 6,091,252 A | 7/2000 | Akram et al. | |
| 6,150,717 A | 11/2000 | Wood et al. | |
| 6,319,065 B1 | 11/2001 | Farnworth et al. | |
| 6,333,555 B1 | 12/2001 | Farnworth et al. | |
| 6,453,550 B1 * | 9/2002 | Farnworth et al. | 29/842 |
| 6,469,532 B2 | 10/2002 | Akram et al. | |
| 6,478,627 B2 * | 11/2002 | Farnworth et al. | 439/632 |

\* cited by examiner

METHOD FOR FORMING MODULAR SOCKETS USING FLEXIBLE INTERCONNECTS AND RESULTING STRUCTURES

CROSS-REFERENCE TO RELATED APPLICATIONS

This application is a continuation of application Ser. No. 09/482,416, filed Jan. 13, 2000, now U.S. Pat. No. 6,453,550 B1, issued Sep. 24, 2002, which is a divisional of application Ser. No. 09/072,260, filed May 4, 1998, now U.S. Pat. No. 6,089,920, issued Jul. 18, 2000.

BACKGROUND OF THE INVENTION

1. Field of the Invention

This invention relates generally to methods and apparatus for electrically connecting semiconductor devices to circuit boards. More particularly, the invention relates to a socket into which one or more bare semiconductor die may be inserted for connection to a circuit board without wire bonding of the contact pads of the semiconductor die.

2. State of the Art

The assembly of a semiconductor device from a leadframe and semiconductor die ordinarily includes bonding of the die to a paddle of the leadframe, and wire bonding bond pads on the die to inner leads i.e. lead fingers of the leadframe. The inner leads, semiconductor die, and bond wires are then encapsulated, and extraneous parts of the leadframe excised, forming outer leads for connection to a substrate such as a printed wiring board (PWB).

The interconnection of such packaged integrated circuits (IC) with circuit board traces has advanced from simple soldering of package leads to the use of mechanical sockets, also variably known as connectors, couplers, receptacles and carriers. The use of sockets was spurred by the desire for a way to easily connect and disconnect a packaged semiconductor die from a test circuit, leading to zero-insertion-force (ZIF), and low-insertion-force (LIF) apparatus. Examples of such are found in U.S. Pat. No. 5,208,529 of Tsurishima et al., U.S. Pat. No. 4,381,130 of Sprenkle, U.S. Pat. No. 4,397,512 of Barraire et al., U.S. Pat. No. 4,889,499 of Sochor, U.S. Pat. No. 5,244,403 of Smith et al., U.S. Pat. No. 4,266,840 of Seidler, U.S. Pat. No. 3,573,617 of Randolph, U.S. Pat. No. 4,527,850 of Carter, U.S. Pat. No. 5,358,421 of Petersen, U.S. Pat. No. 5,466,169 of Lai, U.S. Pat. No. 5,489,854 of Buck et al., U.S. Pat. No. 5,609,489 of Bickford et al., U.S. Pat. No. 5,266,833 of Capps, U.S. Pat. No. 4,995,825 of Korsunsky et al., U.S. Pat. Nos. 4,710,134 and 5,209,675 of Korsunsky, U.S. Pat. No. 5,020,998 of Ikeya et al., U.S. Pat. No. 5,628,635 of Ikeya, U.S. Pat. No. 4,314,736 of Demnianiuk, U.S. Pat. No. 4,391,408 of Hanlon et al., and U.S. Pat. No. 4,461,525 of Griffin.

New technology has enabled the manufacture of very small high-speed semiconductor dice having large numbers of closely spaced bond pads. However, wire bonding of such semiconductor dice is difficult on a production scale. In addition, the very fine wires are relatively lengthy and have a very fine pitch, leading to electronic noise.

In order to meet space demands, much effort has been expended in developing apparatus for stack-mounting of packaged dies on a substrate in either a horizontal or vertical configuration. For example, vertically oriented semiconductor packages having leads directly connected to circuit board traces are shown in U.S. Pat. No. 5,444,304 of Hara et al., U.S. Pat. No. 5,450,289 of Kweon et al., U.S. Pat. No. 5,451,815 of Taniguchi et al., U.S. Pat. No. 5,592,019 of Ueda et al., U.S. Pat. No. 5,619,067 of Sua et al., U.S. Pat. No. 5,635,760 of Ishikawa, U.S. Pat. No. 5,644,161 of Burns, U.S. Pat. No. 5,668,409 of Gaul, and U.S. Reissue Pat. No. Re. 34,794 of Farnworth.

However, none of the above patents relates to the socket interconnection of a bare i.e. unpackaged semiconductor die to a substrate such as a circuit board.

Sockets also exist for connecting daughter circuit boards to a mother board, as shown in U.S. Pat. No. 5,256,078 of Lwee et al. and U.S. Pat. No. 4,781,612 of Thrush. U.S. Pat. Nos. 4,501,461 and Re. 28,171 of Anhalt show connectors for connecting a socket to a circuit board, and wiring to an electronic apparatus, respectively.

U.S. Pat. No. 5,593,927 of Farnworth et al. discloses a semiconductor die having an added protective layer and traces, and which is insertable into a multi-die socket. The conductive edges of the semiconductor die are connected through an edge "connector" to circuit board traces. The number of insertable semiconductor dice is limited by the number of semiconductor die compartments in the socket, and using fewer dice is a waste of space.

SUMMARY OF THE INVENTION

A modular bare die socket is provided by which any number of bare (unpackaged) semiconductor dice having bond pads along the edge of one major side may be interconnected with a substrate in a densely packed arrangement. The socket is particularly applicable to high speed, e.g. 300 MHZ dice of small size or those dice of even faster speeds.

The socket comprises a plurality of plates which have a semiconductor die slot structure for aligning and holding a bare die or dice in a vertical orientation, and interconnect structure for aligning and retaining a multi-layer lead tape in contact with conductive bond pads of an inserted die. The interconnect lead tapes have outer ends which are joined to conductive traces on a substrate such as a printed wiring board (PWB).

Each lead tape includes a node portion which is forced against a bond pad to make resilient contact therewith. Various means for providing the contact force include a resilient lead tape, an elastomeric layer or member biasing the lead tape, or a noded arm of the plate, to which the lead tape is fixed.

A multi-layer interconnect lead tape may be formed from a single layer of polymeric film upon which a pattern of fine pitch electrically conductive leads is formed. Methods known in the art for forming lead frames, including negative or positive photoresist optical lithography, may be used to form the lead tape. The lead tape may be shaped under pressure to the desired configuration.

The plates with intervening interconnect lead tapes are bonded together with adhesive or other means to form a permanent structure.

The plates are formed of an electrically insulative material and may be identical. Each plate has "left side structure" and "right side structure" which work together with the opposing structure of adjacent plates to achieve the desired alignment and retaining of the semiconductor die and the lead tape for effective interconnection.

Any number of plates may be joined to accommodate the desired number of bare semiconductor dice. Assembly is easily and quickly accomplished. If desired, end plates having structure on only one side may be used to cap the ends of the socket.

Thus, a socket is formed as a dense stack of semiconductor die-retaining plates by which the footprint per semiconductor die is much reduced.

The modular socket is low in cost and effectively provides the desired interconnection. A short interconnect lead distance is achieved, leading to reduced noise. The impedance may be matched up to the contact or semiconductor die.

The primary use of the modular bare semiconductor die socket is intended to be for permanent attachment to circuit boards of electronic equipment where die replacement will rarely be required. Although the socket may be used in a test stand for temporarily connecting dice during testing, new testing techniques performed at the wafer scale generally obviate the necessity for such later tests.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

Figure 1:
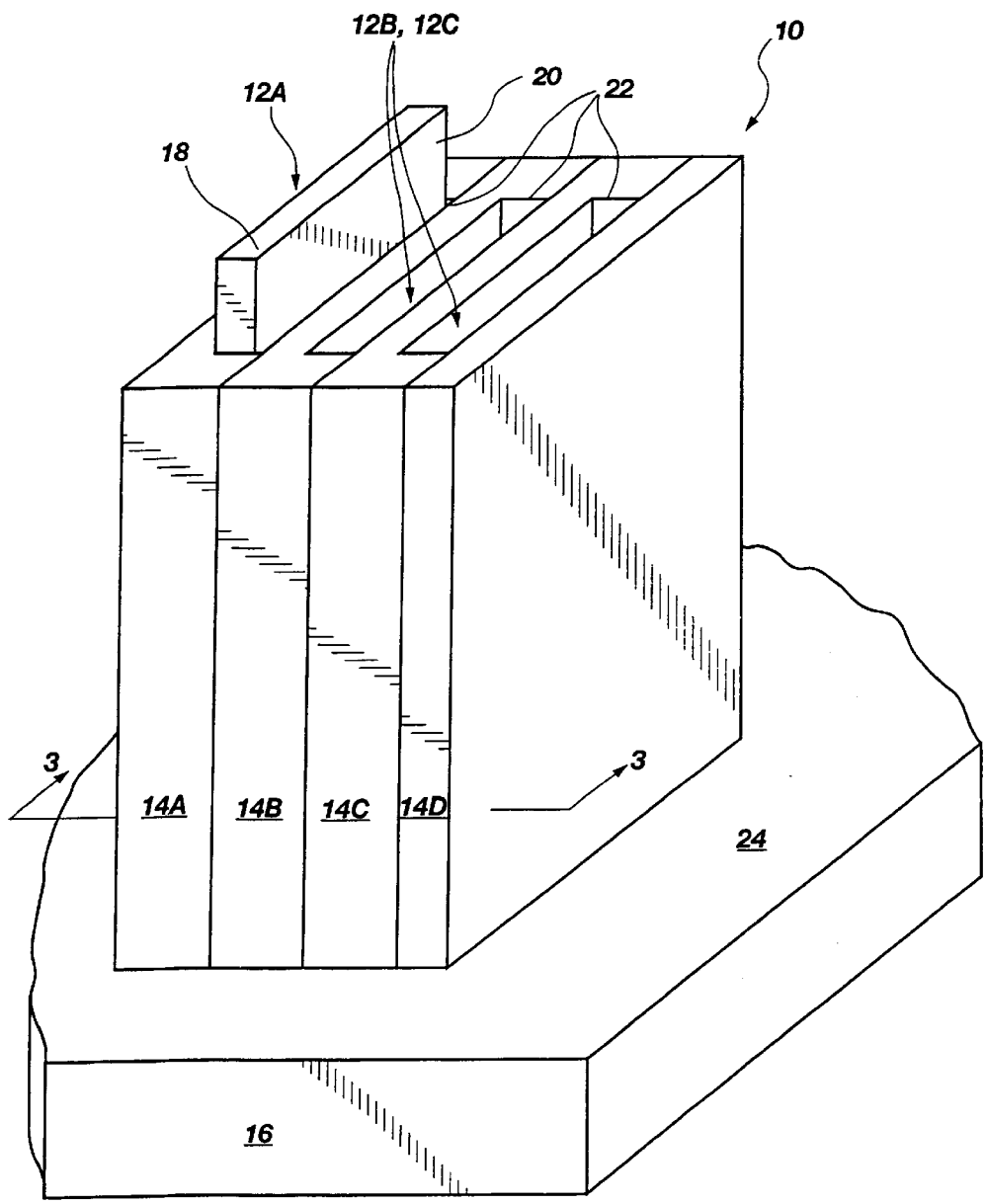
FIG. 1 is a perspective view of a modular socket of the invention.

As depicted in drawing FIG. 1, a modular bare die socket 10 of the invention comprises a plurality of modules 12A, 12B and 12C formed of plates 14A, 14B, 14C, and 14D which are stacked perpendicular to a substrate 16. A bare (unpackaged) semiconductor die 18 with conductive bond pads (not visible) near one edge on a major surface 20 thereof, e.g. the "active surface" may be inserted as shown into a die slot 22 and have its bond pads interconnected to conductive traces (not visible) on the surface 24 of the substrate 16.

Figure 2:
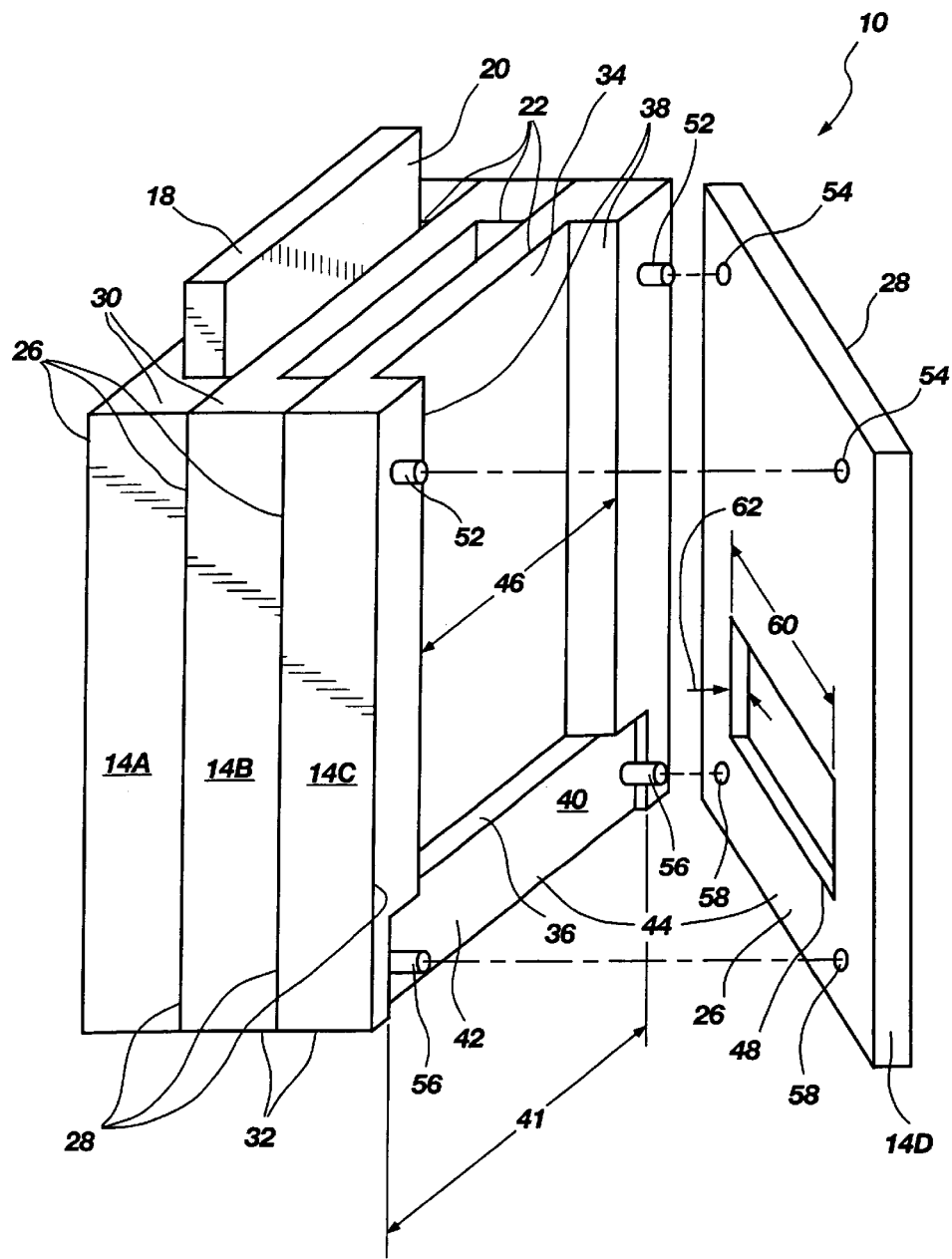
FIG. 2 is a perspective view of partially assembled modules of a modular socket of the invention.

The internal structures of plates 14C and 14D are depicted in drawing FIG. 2. Each of the plates 14A, 14B, 14C and 14D has a first side 26 and an opposing second side 28. The plates have first ends 30 having die slots 22, and second ends 32 having lead slots 44 through which lead tapes pass.

In these figures, the first side 26 is taken as the left side of each plate and the second side 28 is taken as the right side. The regular plates 14A, 14B and 14C have structure on both sides 26, 28 and may be the exclusive plates of the socket 10. The structure provides for accommodating bare semiconductor dice 18 of a particular size, number and spacing of bond pads, etc. and for electrically interconnecting the semiconductor dice 18 to a substrate 16. Typically, all regular plates 14A, 14B, 14C of a bare die socket 10 are identical but in some cases may differ to accommodate semiconductor dice of different size, bond pad configuration, etc. within different modules 12A, 12B, 12C, etc. of a socket.

Figure 3:
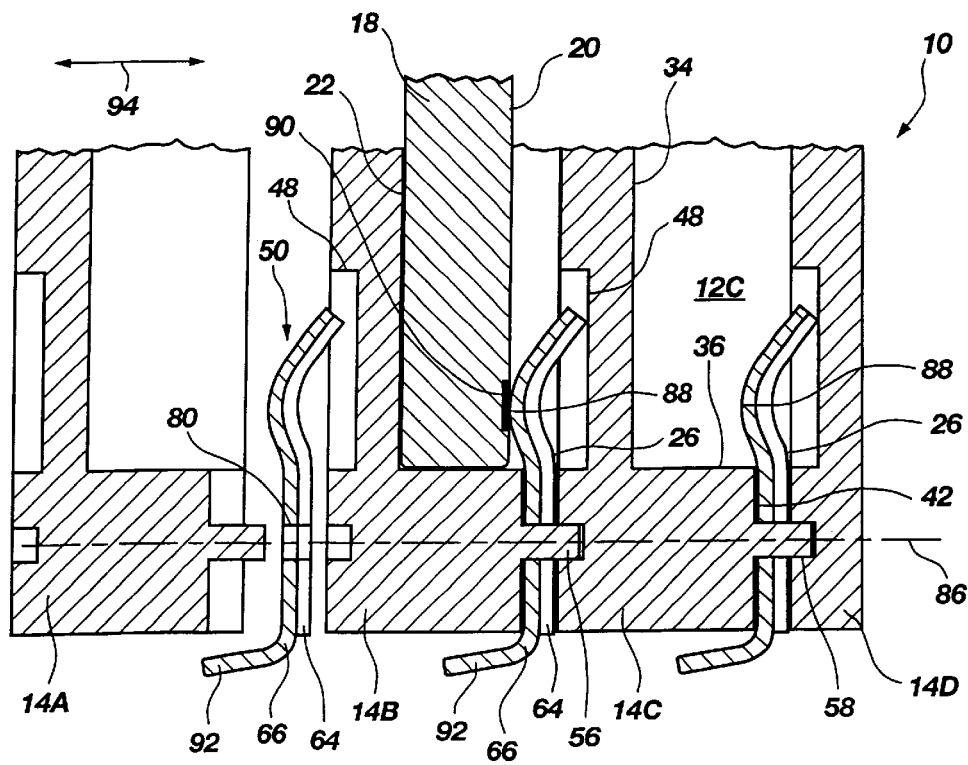
FIG. 3 is a cross-sectional edge view of a portion of a modular socket of the invention, as generally taken along line 3—3 of FIG. 1 and having an exploded portion.

Alternatively, one or two end plates 14D may be used to cap any number of intervening regular plates 14A, 14B and 14C. In contrast to the regular plates 14A, 14B and 14C, such end plates 14D have cooperating structure on one side only, i.e. the internal side, and may simply have a flat exterior side which in drawing FIGS. 1, 2 and 3 is the second side 28. Specifically designed end plates 14D may be used on either, neither or both ends of the socket 10, and have structure on one side to complement the facing side of the adjacent regular plate 14A, 14B, 14C.

The structure of the second side 28 of the regular plates 14A, 14B and 14C is shown as including an upwardly opening die slot 22 with a side wall 34, edge walls 38, and stop end wall 36 of lower beam 40. Lower beam 40 has an exposed surface 42 which is one side of an interconnect lead slot 44. The lower beam 40 is shown as having a width 41 exceeding width 46 for accommodating means for accurate alignment and retention of a multi-layer interconnect lead tape 50, not shown in drawing FIG. 2 but to be described later in relation to drawing FIGS. 3 through 6.

The first sides 26 of plates 14A, 14B, 14C and 14D are as shown with respect to end plate 14D. In this embodiment, first side 26 is largely flat with a recess 48 for accommodating portions of the interconnect lead tape. Recess 48 has a width 60 which is shown to approximate the width 46 of the die slot 22, and has a depth 62 which is sufficient to take up the lead tape 50 when it is compliantly moved into the recess upon insertion of a semiconductor die 18 into die lot 22.

The module 12C including the first side of plate 14D and the second side of plate 14C has alignment posts 52 and matching holes 54 for alignment of the plates 14C, 14D to each other. Also shown are alignment/retention posts 56 and matching holes 58 for (a) aligning and retaining an interconnect lead tape 50 in the module, and for (b) aligning the plates 14C, 14D with each other. The posts 52, 56 and matching holes 54, 58 together comprise a module alignment system.

Mating portions of adjacent plates are joined by adhesive following installation of the lead tape 50 on alignment/retention posts 56. Each of the posts 52, 56 is inserted into holes 54, 58 so that all of the plates 14A, 14B, 14C and 14D are precisely aligned with each other to form a monolithic socket 10. In drawing FIG. 3, all of the regular plates 14A, 14B, and 14C are identical.

Figure 4:
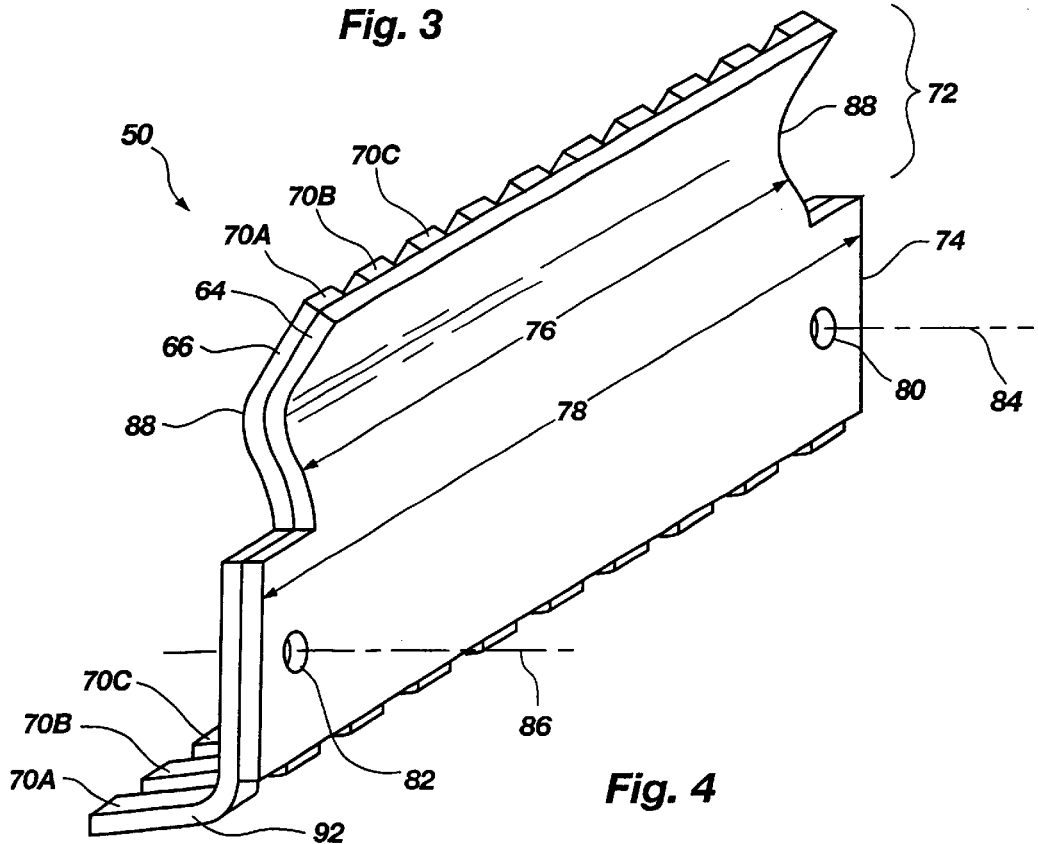
FIG. 4 is a perspective view of a multi-layer lead tape useful in a modular bare die socket of the invention.
Figure 5:
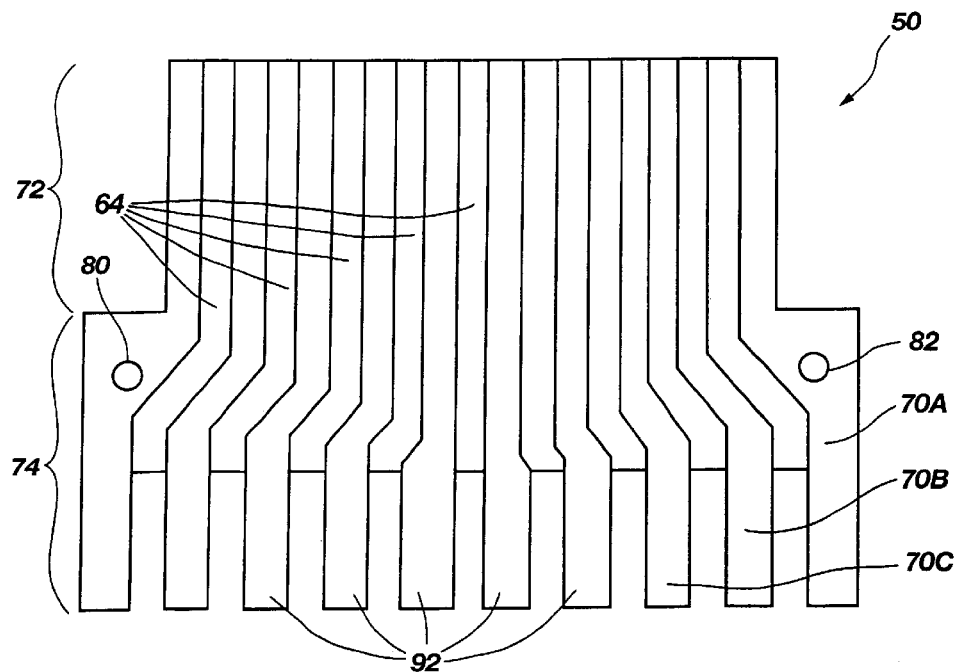
FIG. 5 is a plan view of a multi-layer lead tape useful in a modular bare die socket of the invention.

In the views of drawing FIGS. 3 through 5, a multi-layer interconnect lead tape 50 is shown as comprised of a first insulative layer 64, with a second layer 66 of conductive leads 70 fixed to it. The insulative layer 64 may be formed of a film of polymeric material such as polyimide, polyimide siloxane, or polyester. A conductive layer 66, typically of metal, is formed on the insulative layer 64 in the form of individual leads 70A, 70B, 70C, etc. Methods well-known in the industry for producing multi-layer lead frames may be used for forming the fine pitch leads 70 on the insulative layer 64. Thus, for example, the leads 70 may be formed by combining metal deposition with optical lithography using either a positive or negative photoresist process. Any method capable of providing fine pitch leads 70 on the first layer 64 of the lead tape 50 may be used.

The lead tape 50 has an upper portion 72 which is configured with a total width 76 of leads 70 which generally spans the semiconductor die 18, but will be less than width 46 of die slot 22 (see FIG. 2). A lower portion 74 has a greater width 78 which may correspond generally to width dimension 41 of the lower beam 40 (see FIG. 2). Alignment apertures 80, 82 are formed in the lower portion 74 to be coaxial along axes 84, 86, respectively, with alignment/retention posts 56.

The upper portion 72 includes lead portions which contact the bond pads 90 of the dice. The lower portion 74 includes lead portions which are joined to substrate 16.

In the embodiments of drawing FIGS. 3, 4, 5 and 5A, the lead tape 50 is shown as being formed in the general shape of the letter "S". A contact node 88 is formed in each lead 70 in the upper portion 72 by forming the upper portion as a bend. The node 88 is configured to be pushed away by contact with a bond pad 90 of a semiconductor die. The resistance to bending of the lead produces compression therebetween and enables consistent electrical contact with the bond pad 90 of a semiconductor die. Where the surfaces of the bond pads 90 of the semiconductor die 18 are essentially coplanar, contact between the bond pads 90 and the leads 70 is maintained. The compressive force between the semiconductor die 18 and the leads 70 is dependent upon the particular material of insulative layer 64 and its thickness, the thickness and material of conductive layer 66, and lead displacement from the unbiased position which results from die insertion. Typically, the insulative layer 64 may vary in thickness from about 12 to about 300 μm. The preferred thickness of the conductive layer 66 is about 25 to about 75 μm. The total thickness of the combined first and second layers of the lead tape 50 is preferred to be from about 75 μm to about 100 μm.

The lower ends 92 of leads 70 are shown as bent to a nearly horizontal position for surface attachment to a substrate 16.

The lower ends 92 are shown as having the insulative layer 64 removed to provide a metal surface for attachment by soldering or other method to a substrate 16.

Figure 5A:
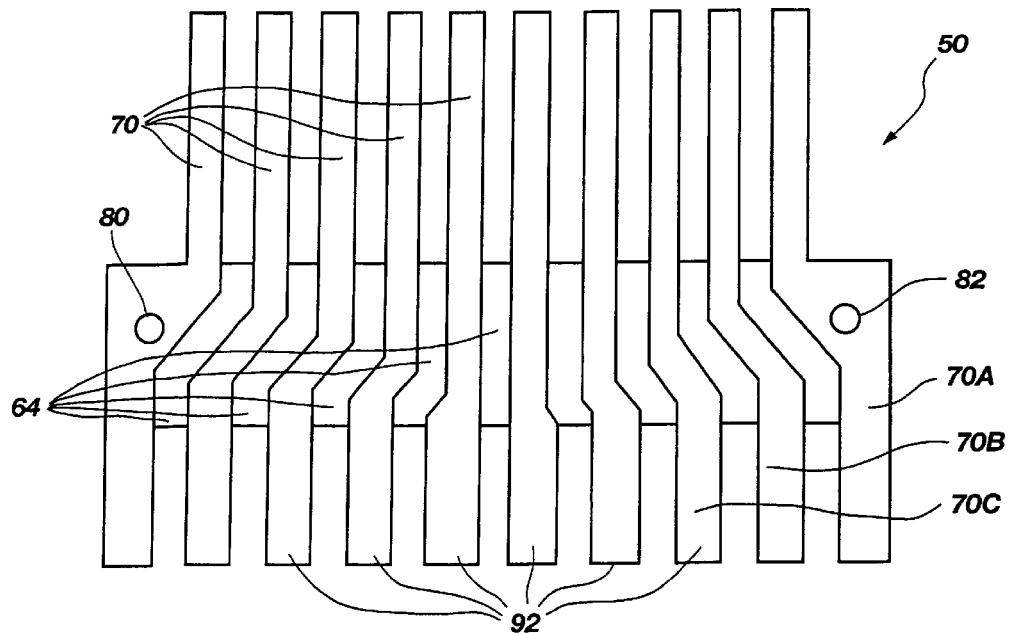
FIG. 5A is a plan view of another embodiment of a multi-layer lead tape of a modular bare die socket of the invention.

In a variation of the lead tape 50 shown in drawing FIG. 5A, the upper ends of the leads 70, i.e. the leads in the upper portion 72, may have both the insulative layer 64 and conductive layer 66 removed between the leads, thereby singulating them. Each lead 70 retains both layers 64, 66 for retaining a required resistance to bending in each lead. Thus, each lead is independently compliant with respect to an inserted semiconductor die 18 to retain conductive contact with a bond pad 90 on the semiconductor die 18.

Figure 6:
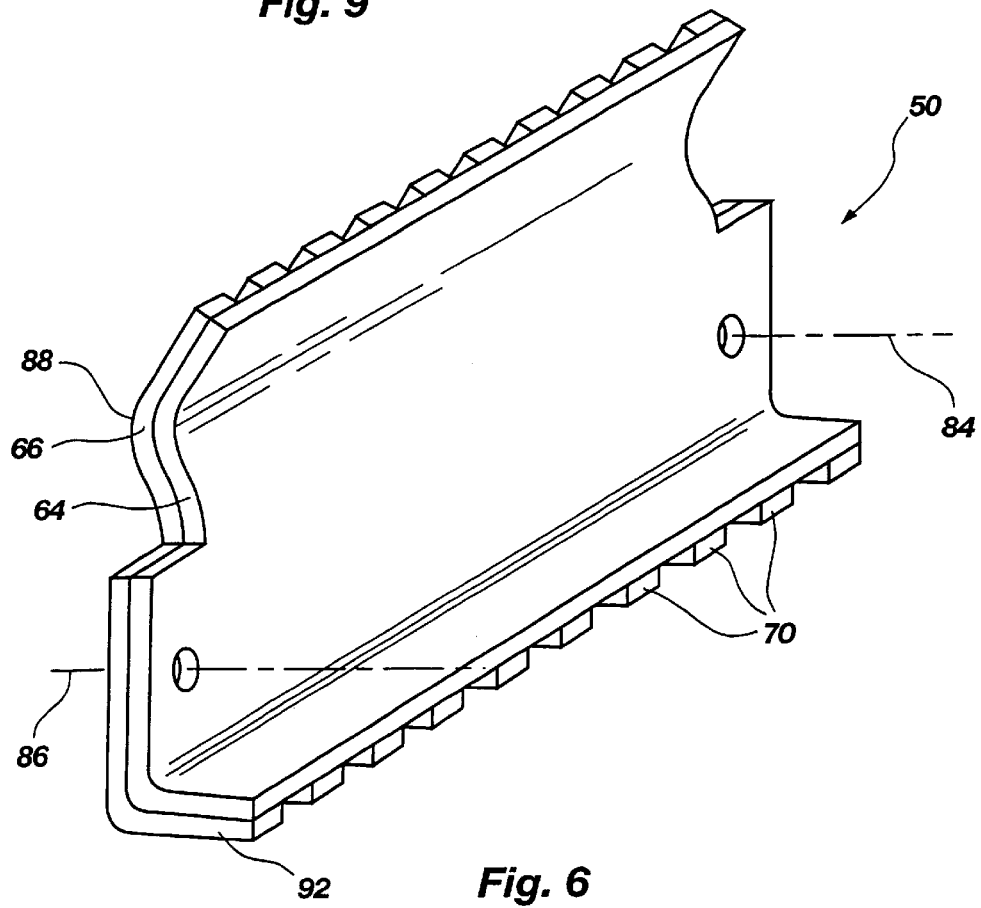
FIG. 6 is a perspective view of a further embodiment of a multi-layer lead tape of a modular bare semiconductor die socket of the invention.

An alternative embodiment of the interconnect lead tape 50 is depicted in drawing FIG. 6. The lower ends 92 of leads 70 are bent in the opposite direction from drawing FIGS. 5 and 5A and in addition, the insulative layer 64 is not removed from the lower ends 92.

The lead tape 50 may be bent to the desired shape by a suitable stamping tool or the like, wherein the "at-rest" shape is uniform from tape to tape.

The placement of the module components, i.e. the die slot 22, lower beam 40, interconnect lead slot 44, and recess 48 may be varied in the longitudinal direction 94 (see FIG. 3) of the plates, and may be apportioned in any convenient way between the first side 26 of one plate and the facing second side 28 of an adjacent plate.

Figure 9:
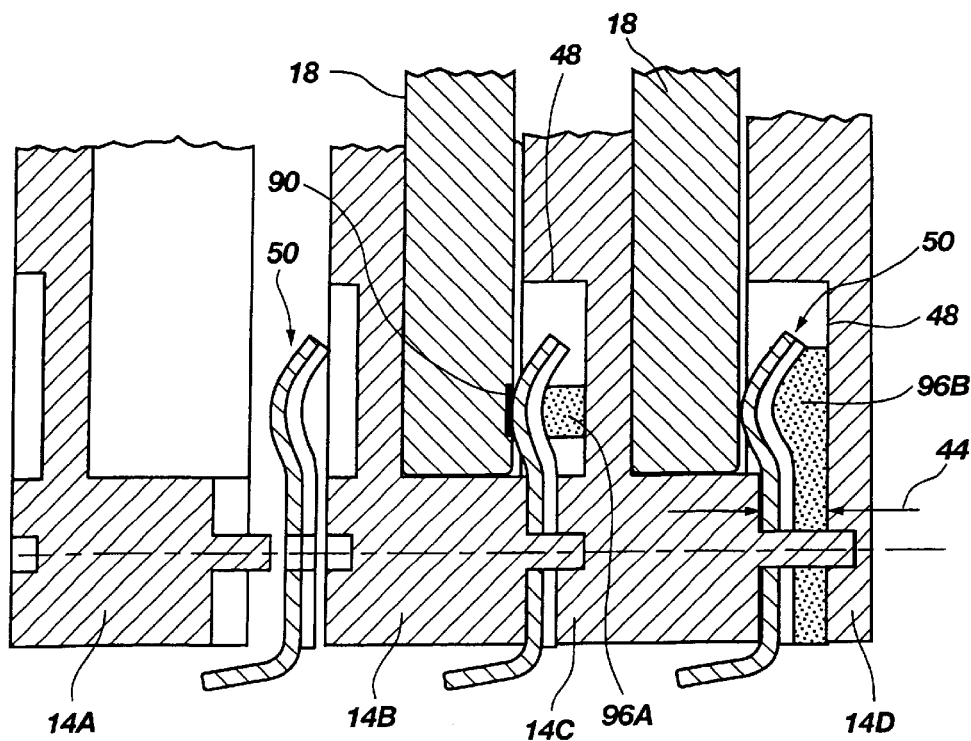
FIG. 9 is a cross-sectional edge view of a portion of a further embodiment of a modular bare semiconductor die socket of the invention, as taken along line 3—3 of FIG. 1, and having an exploded portion.
Figure 7:
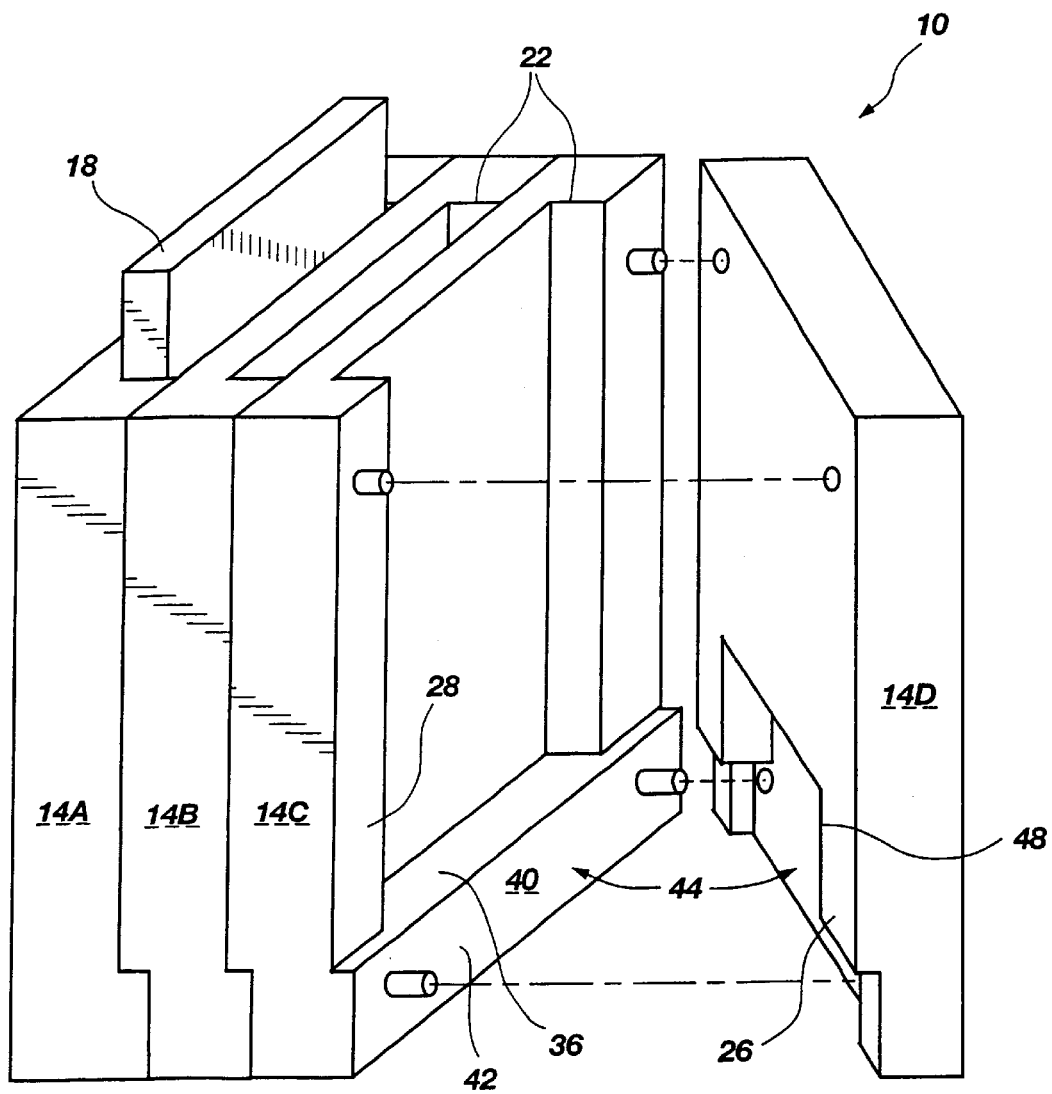
FIG. 7 is a perspective view of partially assembled modules of a further embodiment of a modular bare semiconductor die socket of the invention.
Figure 8:
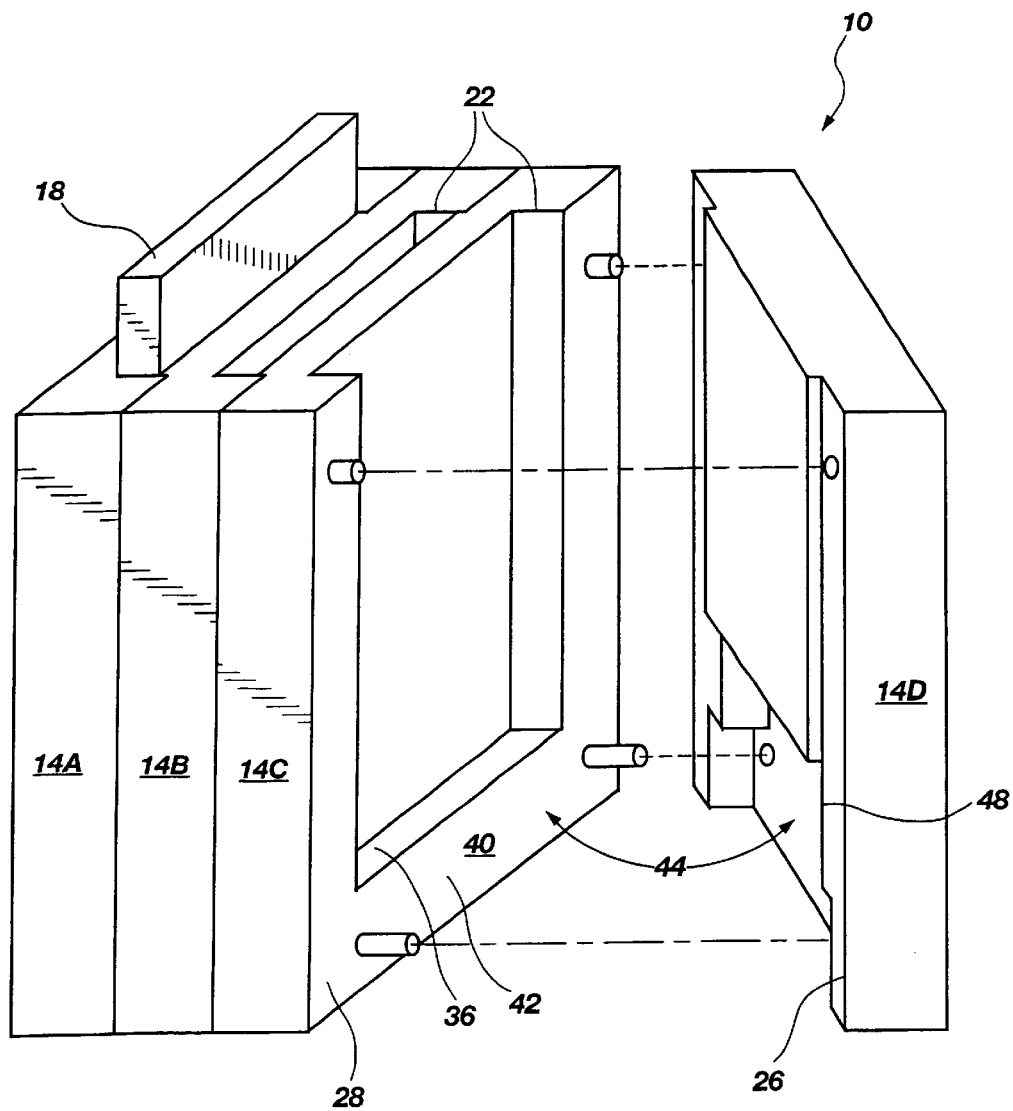
FIG. 8 is a perspective view of partially assembled modules of an additional embodiment of a modular bare semiconductor die socket of the invention.

Turning now to drawing FIGS. 7, 8 and 9, several other embodiments of the modular socket 10 are illustrated. As depicted in drawing FIG. 7, a plurality of regular plates 14A, and 14B, 14C and an end plate 14D, the plates providing for an interconnect lead tape 50 using a compressible elastomeric member 96 to bias the tape to the bond pads 90 of the semiconductor die 18. The elastomeric member may be formed of silicone foam, solid silicone that has been perforated, or low durometer hardness silicone which is attached to the tape by adhesive. The elastomeric member 96 may be variably shaped as a narrow strip 96A with limited biasing strength to a more general coverage 96B with greater biasing strength. Both are illustrated in drawing FIG. 9. The narrow strip 96A is intended to be used in the module design of drawing FIG. 7, and the high coverage member 96B may be used in the module embodiment of drawing FIG. 8, wherein sufficient space is provided in the interconnect lead slot 44 for the elastomeric member. Preferably, the elastomeric member 96A or 96B comprises a single continuous unit extending across all of the leads 70. Alternatively, a series of elastomeric members 96 may be arrayed on the tape 50.

Figure 10:
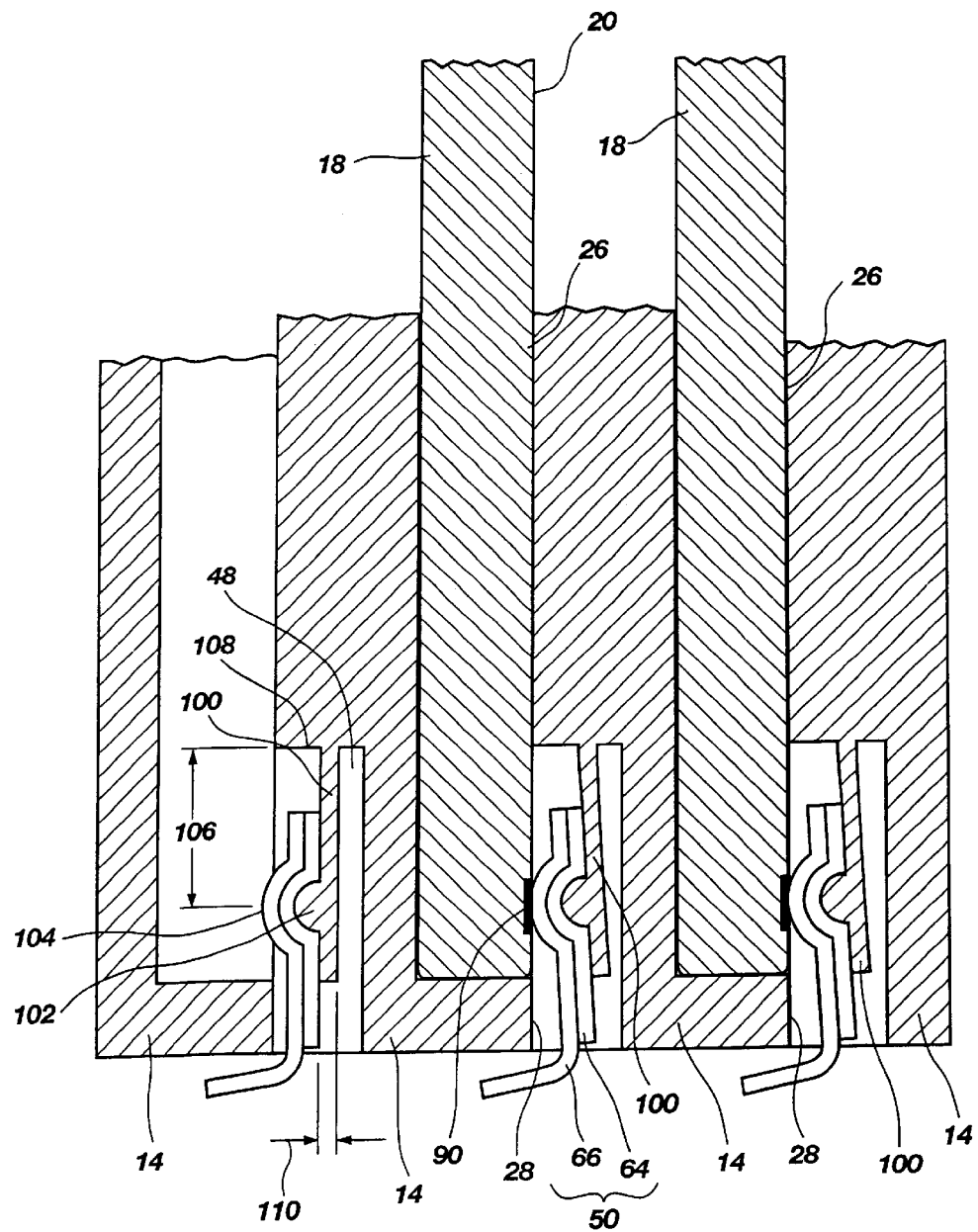
FIG. 10 is a cross-sectional edge view of a portion of another embodiment of a modular bare semiconductor die socket of the invention, as taken along line 3—3 of FIG. 1.
Figure 11:
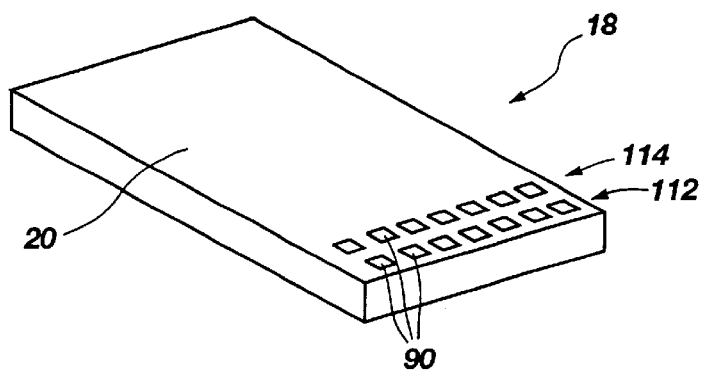
FIG. 11 is a view of a semiconductor die for use in the modular bare semiconductor die socket of FIG. 10.
Figure 12:
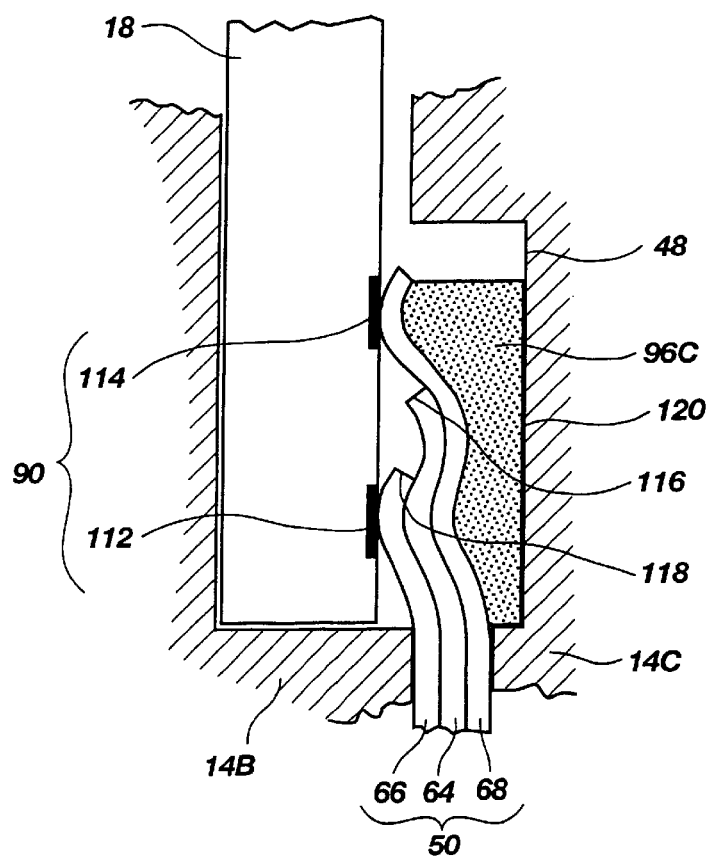
FIG. 12 is a view of the semiconductor die of FIG. 11 used in the modular bare semiconductor die socket of FIG. 10.

Referring to drawing FIG. 10, illustrated is another form of the invention, in which the compliant member of a module 12 comprises a projecting portion 100 of the plate 14. The projecting portion 100 may be in the form of a ledge, as shown in the figure, and includes a longitudinal ridge 102 within a recess 48 in the side 26. A multi-layer interconnect lead tape is attached, e.g. by adhesive to the projecting portion 100 and ridge 102. The resulting node 104 in the lead tape 50 is forced away by an inserted die 18 and forcibly abuts the bond pads on the die surface 20. The force holding the leads 70 against inserted bond pads 90 of a semiconductor die 18 will depend upon the distance 106 from the node 104 to the attachment point 108 of the ridge 102. In order to provide the desired effect, the polymeric material of the plate 14 and projecting portion 100 is selected in combination with distance 106 and ledge thickness 110. In this embodiment, it is unnecessary for the lead tape 50 to be aligned and retained on alignment posts.

Where a bare semiconductor die 18 has two rows of bond pads 90, illustrated in drawing FIG. 11 as first row 112 and second row 114, the lead tape 50 of the modular socket 10 may be adapted for lead contact with both rows. A lead tape 50 for providing contact with two rows 112, 114 of bond pads 90 is shown in drawing FIG. 12. The tape 50 comprises three layers including a first insulative layer 64, a second conductive layer 66 for contacting the first row 112 of bond pads 90, and a third conductive layer 68 for contacting the second row 114 of bond pads on the die 18. The first and second layers 64, 66 are terminated at locations 116, 118, respectively, between the first and second rows 112, 114 of bond pads. An elastomeric member 96C such as a foam is attached to the third layer 68 and abuts the recess wall 120. The member 96C is compressed by insertion of the semiconductor die 18 into the socket and retains forced contact between the leads and bond pads.

Figure 13:
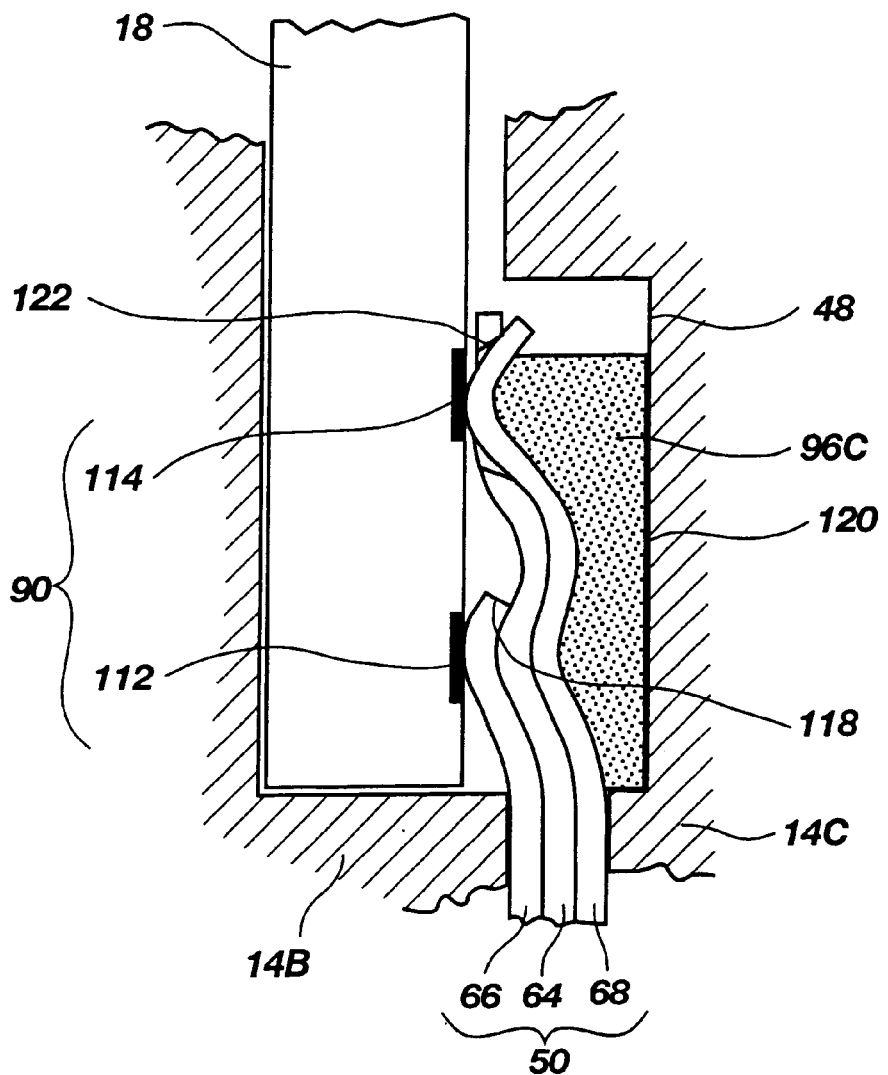
FIG. 13 is a view of an alternative embodiment of the semiconductor die and modular bare semiconductor die socket of FIG. 12 illustrating a modified lead tape.

As shown in drawing FIG. 13, the first (insulative polymer) layer 64 may alternatively be provided with holes 122 through which individual leads 70 of the third (conductive) layer 68 are preinserted for contact with the second row 114 of bond pads 90.

The foregoing delineates several examples of the use of a multi-layer lead tape with means for contacting the bond pads of a bare die. Other types of biasing apparatus may be used for maintaining contact between interconnect leads 70 and the bond pads 90 of a semiconductor die 18, including mechanical springs suitable for the miniature devices.

The plates 14A, 14B, 14C, 14D, etc. may be molded of a suitable insulative polymeric material, examples of which include polyether sulfone, polyetherether ketone (PEEK), or polyphenylene sulfide.

Following assembly of the modular socket 10 and attachment to a substrate 16, the modular socket, or portions thereof, may be "glob-topped" with insulative sealant material, typically a polymer.

The socket 10 of the invention permits connection of bare semiconductor dice with very fine pitch bond pads to substrates, whereby short leads are used for improved performance. The semiconductor dice may be readily replaced without debonding of wires or other leads. Multiple semiconductor dice may be simultaneously connected to a substrate, and the apparatus permits high density "stacking" of a large number of dice. The socket uses leads which may be produced by well-developed technology, and is easily made in large quantity and at low cost.

It is apparent to those skilled in the art that various changes and modifications may be made to the bare die socket module of the invention, sockets formed therefrom and methods of making and practicing the invention as disclosed herein without departing from the spirit and scope of the invention as defined in the following claims. It is particularly noted that with respect to numbers and dimensions of elements, the illustrated constructions of the various embodiments of the modular bare semiconductor die socket are not presented as a limiting list of features but as examples of the many embodiments of the invention.

What is claimed is:

1. A method for forming a semiconductor die module having a semiconductor die inserted thereinto for connecting said semiconductor die to a substrate having conductors thereon, said semiconductor die having a plurality of conductive bond pads on a surface thereof, said method comprising:

providing a first plate having first and second major sides with corresponding first and second ends;

providing a second plate having first and second major sides with corresponding first and second ends;

providing a multi-layer interconnect lead tape having first ends and second ends, said multi-layer interconnect lead tape including a pattern of electrically conductive leads formed on an insulative film, said conductive leads having inner first ends for resilient electrical contact with said bond pads of said semiconductor die and outer ends for electrical contact with said conductors on said substrate;

providing a compressible elastomeric apparatus for contacting a portion of said multi-layer interconnect lead tape for the biasing thereof when located between a portion of said first plate and a portion of said second plate;

abutting said second major side of said first plate and said first major side of said second plate forming a bare die socket having a die slot located at each first end of said first plate and said second plate and forming a lead slot located at each second end of said first plate and said second plate, said first ends of said multi-layer interconnect lead tape extending between said second major side of said first plate and said first major side of said second conductive leads having a first end or resilient electrical contact with said at least one conductive bond pad of said semiconductor die and a second end for electrical contact with at least one conductor of said plurality on said substrate;

abutting said second major side of said first plate and first major side of said second plate forming a bare die socket having a die slot at each of a first end of said first plate and a first end of said second plate and a lead slot at each of a second end of said first plate and a second end of said second plate, said first end of each electrically conductive lead of said multi-layer interconnect lead tape extending between said second major side of said first plate and said first major side of said second plate and said second end of each electrically conductive lead of said multi-layer interconnect lead tape extending beyond said second end of said first plate and said second end of said second plate; and inserting said semiconductor die into said bare die socket.

2. The method of claim 1, further comprising:

resiliently biasing said first ends of said multi-layer interconnect lead tape.

3. The method of claim 1, further comprising:

contacting said second ends of said multi-layer interconnect lead tape with said conductors on said substrate.

4. The method of claim 1, further comprising:

providing a third plate having first and second major sides and corresponding first and second ends; and abutting said first major side of said third plate with said second major side of said second plate, thereby forming another bare die socket.

5. A method for forming a semiconductor die module having a semiconductor die inserted thereinto, said semiconductor die having at least one conductive bond pad on a surface thereof, said method comprising:

providing a substrate having a plurality of conductors thereon;

providing a first plate having a first major side and a second major side, each first major side and second major side having a corresponding first end and second end;

providing a second plate having a first major side and a second major side, each first major side and second major side having a corresponding first end and second end;

providing a multi-layer interconnect lead tape having a plurality of electrically conductive leads formed on an insulative film, each conductive lead of said plurality of electrically conductive leads having a first end for resilient electrical contact with said at least one conductive bond pad of said semiconductor die and a second end for electrical contact with at least one conductor of said plurality on said substrate;

abutting said second major side of said first plate and said first major side of said second plate forming a bare die socket having a die slot at each of a first end of said first plate and a first end of said second plate and a lead slot at each of a second end of said first plate and a second end of said second plate, said first end of each electrically conductive lead of said multi-layer interconnect lead tape extending between said second major side of said first plate and said first major side of said second plate and said second end of each electrically conductive lead of said multi-layer interconnect lead tape extending beyond said second end of said first plate and said second end of said second plate; and inserting said semiconductor die into said bare die socket.

6. The method of claim 5, further comprising:

providing a resilient apparatus; and resiliently biasing said first end of each electrically conductive lead of said multi-layer interconnect lead tape.

7. The method of claim 5, further comprising:

contacting said second end of each electrically conductive lead of said multi-layer interconnect lead tape with a conductor of said plurality of said substrate.

8. The method of claim 5, further comprising:

providing a third plate having a first major side and a second major side, each major side having a corresponding first end and second end; and abutting said first major side of said third plate with said second major side of said second plate forming another bare die socket.

9. The method of claim 8, further comprising:

inserting another semiconductor die into said another bare die socket to attach another semiconductor die to said substrate.

10. The method of claim 8, further comprising:

inserting another semiconductor die into said another bare die socket.

* * * * *

UNITED STATES PATENT AND TRADEMARK OFFICE
CERTIFICATE OF CORRECTION

PATENT NO. : 6,760,970 B2  Page 1 of 1
APPLICATION NO. : 10/218334
DATED : July 13, 2004
INVENTOR(S) : Warren M. Farnworth, David J. Corisis and Salman Akram It is certified that error appears in the above-identified patent and that said Letters Patent is hereby corrected as shown below:

In the claims:
CLAIM 1, COLUMN 8, LINES 15-19, change "second conductive leads having a first end or resilient electrical contact with said at least one conductive bond pad of said semiconductor die and a second end for electrical contact with at least one conductor of said plurality on said substrate;" to --second plate and said second ends of said multi-layer interconnect lead tape extending beyond each second end of said first plate and said second plate; and--
CLAIM 1, COLUMN 8, LINES 20-32, delete entire paragraph: "abutting said second major side . . . end of said second plate; and"
CLAIM 1, COLUMN 8, LINE 33, change "bare die socket." to --bare die socket for connecting said semiconductor die to said conductors of said substrate.--

Signed and Sealed this

Twenty-seventh Day of November, 2007

JON W. DUDAS
*Director of the United States Patent and Trademark Office*